United States Patent
Chen et al.

(10) Patent No.: US 8,350,246 B2
(45) Date of Patent: Jan. 8, 2013

(54) STRUCTURE OF POROUS LOW-K LAYER AND INTERCONNECT STRUCTURE

(75) Inventors: Mei-Ling Chen, Kaohsiung (TW); Kuo-Chih Lai, Tainan (TW); Su-Jen Sung, Hsinchu County (TW); Chien-Chung Huang, Taichung County (TW); Yu-Tsung Lai, Taichung County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/038,612

(22) Filed: Mar. 2, 2011

(65) Prior Publication Data
US 2011/0147948 A1 Jun. 23, 2011

Related U.S. Application Data

(62) Division of application No. 11/672,307, filed on Feb. 7, 2007, now Pat. No. 7,947,565.

(51) Int. Cl.
*H01L 33/16* (2010.01)
*H01L 21/443* (2006.01)

(52) U.S. Cl. ............ 257/3; 257/774; 438/409; 438/781; 438/783; 427/245

(58) Field of Classification Search .................. None
See application file for complete search history.

(56) References Cited

U.S. PATENT DOCUMENTS

| | | | |
|---|---|---|---|
| 6,159,842 A | 12/2000 | Chang et al. | |
| 6,383,950 B1 | 5/2002 | Pangrle et al. | |
| 6,548,901 B1 | 4/2003 | Cote et al. | |
| 6,605,545 B2 | 8/2003 | Wang | |
| 6,677,680 B2 | 1/2004 | Gates et al. | |
| 6,693,046 B2 | 2/2004 | Takigawa et al. | |
| 6,783,862 B2 * | 8/2004 | Hedrick et al. | 428/447 |
| 6,844,257 B2 | 1/2005 | Fornof et al. | |
| 6,917,108 B2 | 7/2005 | Fitzsimmons et al. | |
| 6,933,586 B2 | 8/2005 | Fornof et al. | |
| 6,963,137 B2 * | 11/2005 | Giles | 257/759 |
| 2007/0173071 A1 | 7/2007 | Afzali-Ardakani et al. | |
| 2008/0171431 A1 * | 7/2008 | Yu et al. | 438/618 |

FOREIGN PATENT DOCUMENTS

| | | |
|---|---|---|
| CN | 1391235 | 1/2003 |
| JP | 08-59362 | 3/1996 |
| JP | 11-97533 | 4/1999 |
| JP | 2004-274052 | 9/2004 |
| JP | 2005-504433 | 2/2005 |
| JP | 2005-522053 | 7/2005 |

OTHER PUBLICATIONS

Japanese Examination Report of Japan Application No. 2007-099820, dated Mar. 17, 2011.
Chinese Examination Report of Taiwan Application No. 096104571, dated Jan. 31, 2011.

* cited by examiner

*Primary Examiner* — Zandra Smith
*Assistant Examiner* — Pamela E Perkins
(74) *Attorney, Agent, or Firm* — J.C. Patents

(57) ABSTRACT

A structure of a porous low-k layer is described, comprising a bottom portion and a body portion of the same atomic composition, wherein the body portion is located on the bottom portion, and the bottom portion has a density higher than the density of the body portion. An interconnect structure is also described, including the above porous low-k layer, and a conductive layer filling up a damascene opening in the porous low-k layer.

25 Claims, 4 Drawing Sheets

STRUCTURE OF POROUS LOW-K LAYER AND INTERCONNECT STRUCTURE

CROSS-REFERENCE TO RELATED APPLICATION

This application is a divisional application of and claims the priority benefit of U.S. application Ser. No. 11/672,307, filed on Feb. 7, 2007, now allowed. The entirety of the above-mentioned patent application is hereby incorporated by reference herein and made a part of this specification.

BACKGROUND OF THE INVENTION

1. Field of Invention

This invention relates to an integrated circuit (IC) fabricating process and related structures, and more particularly to a forming method and a structure of a porous low-k layer, an interconnect process and an interconnect structure.

2. Description of Related Art

As the linewidth of IC devices is unceasingly reduced, the affect to the RC delay effect to the speed of the devices continuously becomes larger. One way to reduce the RC delay effect is to decrease the parasite capacitance in the interconnect structure, and the parasite capacitance may be decreased by decreasing the dielectric constant of the dielectric layers in the interconnect structure, i.e., by forming the dielectric layers from a low-k material that has a dielectric constant lower than that ($\approx 4.0$) of silicon oxide.

Currently, the low-k materials frequently used include organic low-k materials, porous low-k materials and so on, wherein a porous low-k material may be formed with a sol-gel method, a spin-on method or a chemical vapor deposition (CVD) method that usually uses a framework precursor for forming the framework of the porous structure and a porogen (or a porogen precursor). The porogen will be removed after the porous low-k layer is formed.

Though the dielectric constant of a porous low-k layer can be lower below 2.0, a porous low-k layer easily causes a undesired etching profile possibly because of its low density as compared with non-porous materials and the resulting etching rate difference between the porous low-k layer and the adjacent films. For example, a porous low-k layer may cause an undesired etching profile in an etching step for forming a damascene opening in a damascene process, as shown in FIG. 1.

Referring to FIG. 1, in the damascene process, a porous low-k layer 120 and a hard mask layer 130 are sequentially formed on a substrate 100 having thereon a conductive layer 110 to be connected. A via hole 140 is then formed in the hard mask layer 130 and the porous low-k layer 120 through anisotropic etching, and then the via hole 140 is filled with a conductive material to form a conductive plug (not shown). Possibly because the etching rate difference between the porous low-k layer 120 and the non-porous hard mask layer 130 is large, a kink profile 132 easily occurs to the hard mask layer 130 around the via hole 140. The kink profile 132 will interfere with the filling of the conductive material later, so that the quality of the resulting is lowered.

Moreover, when a cap layer is disposed under the porous low-k layer and the damascene opening has to be formed through the cap layer, a kink etching profile also occurs to the cap layer. Referring to FIG. 4, a damascene opening 440 exposing a portion of the conductive layer 410 to be connected is formed through a hard mask layer 430, a porous low-k layer 420 and a cap layer 415 on the substrate, wherein the cap layer 415 has a kink profile 417 and the hard mask layer 430 has a kink profile 432. The two kink profile 417 and 432 both interfere with the filling of the conductive material.

SUMMARY OF THE INVENTION

Accordingly, this invention provides a method of forming a porous low-k layer that does not cause an undesired etching profile, especially a kink profile.

This invention also provides an interconnect process that can utilize the method of forming a porous low-k layer of this invention to form the porous low-k layer therein.

This invention further provides a structure of a porous low-k layer, which does not cause an undesired etching profile and can be formed with the method of forming a porous low-k layer of this invention.

This invention further provides an interconnect structure that can be formed with the interconnect process of this invention.

The method of forming a porous low-k layer of this invention is described below. A CVD process in which a framework precursor and a porogen precursor are supplied is performed to a substrate. In an end period of the supply of the framework precursor, the value of at least one deposition parameter negatively correlated with the density of a product of the CVD process is decreased.

It is preferred that the porogen size in the CVD process does not exceed 100 Å. It is noted that in this invention, the size of a porogen is defined by the size of the pore in the porous low-k layer that is caused by the porogen.

In some embodiment, the deposition parameter is the flow rate of the porogen precursor. In the end period, the flow rate of the porogen precursor may be set to zero or a fixed positive value, or may be decreased to 0 or a positive value with time in two or more steps. It is preferred that the CVD process deposits a thickness no more than 250 Å in any period in which the flow rate of the porogen precursor is zero.

In some embodiments, the deposition parameter is the porogen size. The porogen size is constant, or is decreased with time in two or more steps, in the end period.

In certain cases, the above method of forming a porous low-k layer of this invention may further include setting the value of the deposition parameter in an initial period of the supply of the framework precursor that is smaller than the value set after the initial period but before the end period. When the deposition parameter is the flow rate of the porogen precursor. The flow rate of the porogen precursor may be set to zero or a fixed positive value, or may be increased from 0 or a positive value with time in two or more steps, in the initial period. When the deposition parameter is the porogen size, the porogen size may be constant, or may be increased with time in two or more steps, in the initial period.

The interconnect process of this invention is described below. A substrate having thereon a conductive layer to be connected is provided. A CVD process is utilized to form a porous low-k layer on the substrate, wherein the porous low-k layer includes a top portion, a bottom portion and a body portion of the same atomic composition, the body portion is between the top portion and the bottom portion, and the top portion has a density higher than that of the body portion. A hard mask layer is formed on the porous low-k layer. A damascene opening is formed in the hard mask layer and the porous low-k layer exposing at least a portion of the conductive layer to be connected. A conductive material layer is formed over the substrate filling up the damascene opening.

In some embodiments of the above interconnect process, a framework precursor and a porogen precursor are supplied in the CVD process. In an end period of the supply of the framework precursor, the value of at least one deposition parameter negatively correlated with the density of a product of the CVD process is decreased. In addition, when the substrate is provided with a cap layer thereon covering the conductive layer to be connected, the bottom portion also has a density higher than that of the body portion. To make the bottom portion have a density higher than that of the body portion, the value of the deposition parameter is set, in an initial period of the supply of the framework precursor, smaller than the value set after the initial period but before the end period.

The structure of a porous low-k layer of this invention includes a top portion, a bottom portion and a body portion of the same atomic composition. The body portion is between the top portion and the bottom portion. The top portion has a density higher than that of the body portion.

The interconnect structure of this invention includes a substrate having a first conductive layer thereon, an above-mentioned porous low-k layer and a second conductive layer. The top portion, the bottom portion and the body portion together have a damascene opening therein over the first conductive layer. The second conductive layer fills up the damascene opening and contacts with the first conductive layer.

The pore size of the porous low-k layer preferably does not exceed 100 Å. In an embodiment, the top portion has no pore therein. The thickness of such a top portion preferably does not exceed 250 Å. In another embodiment, the pore number density in the top portion of the porous low-k layer increases from zero or a positive value in two or more steps in a depth direction of the porous low-k layer, and the pore size in the top portion is equal to that in the body portion. The thickness of a fraction of such a top portion where the pore number density is zero is preferably no more than 250 Å. It is noted that in this invention, a pore number density is defined as the number of pores in unit volume of the CVD product. When the pore size is fixed, a higher pore number density means a lower density (mass/volume) for a porous material.

In still another embodiment, the pores in the top portion have one first size, the pores in the body portion has one second size, and the one first size is smaller than the one-second size. In still another embodiment, the pore size in the top portion increases from a positive value in two or more steps in a depth direction of the porous low-k layer, but is smaller than a pore size in the body portion.

The interconnect structure of this invention may further include a cap layer located between the substrate and the porous low-k layer and penetrated by the second conductive layer, wherein the bottom portion also has a density higher than that of the body portion. In an embodiment, the bottom portion has no pore therein. In another embodiment, the pore number density in the bottom portion decreases to zero or, a positive value in two or more steps in the depth direction of the porous low-k layer, and the pore size in the bottom portion is equal to that in the body portion. In still another embodiment, the pores in the bottom portion has one first size, the pores in the body portion has one second size, and the one first size is smaller than the one second size. In still another embodiment, the pore size in the bottom portion decreases to a positive value in two or more steps in the depth direction of the porous low-k layer and is smaller than a pore size in the body portion.

Since the top portion of the porous low-k layer directly connected with the hard mask layer has a density higher than that of the body portion in the interconnect process, in the etching process for forming the damascene opening, the top portion can have an etching rate closer to that of the hard mask layer so that a kink profile does not easily occur to the hard mask layer and the opening can be easily filled with a conductive material.

Moreover, when the substrate is provided further having a cap layer thereon covering the conductive layer to be connected, the bottom portion of the porous low-k layer directly connected with the cap layer may also have a density higher than that of the body layer. Therefore, in the etching process for forming the damascene opening, the top portion and the bottom portion each can have an etching rate closer to that of the hard mask layer so that a kink profile does not easily occur to the hard mask layer or the cap layer and the opening can be easily filled with a conductive material.

In order to make the aforementioned and other objects, features and advantages of the present invention comprehensible, a preferred embodiment accompanied with figures is described in detail below.

DESCRIPTION OF EMBODIMENTS

First Embodiment

Figure 1:
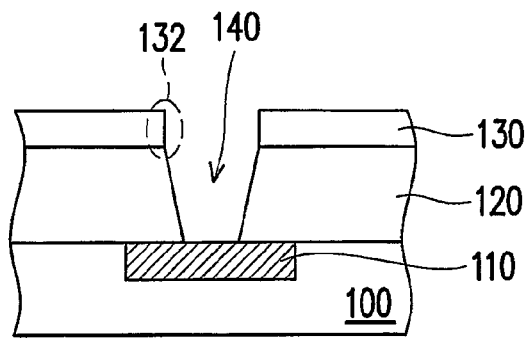
FIG. 1 depicts a kink profile formed in an etching step which forms a damascene opening in a stack of a porous low-k layer and a hard mask layer thereon in the prior art.
Figure 2:
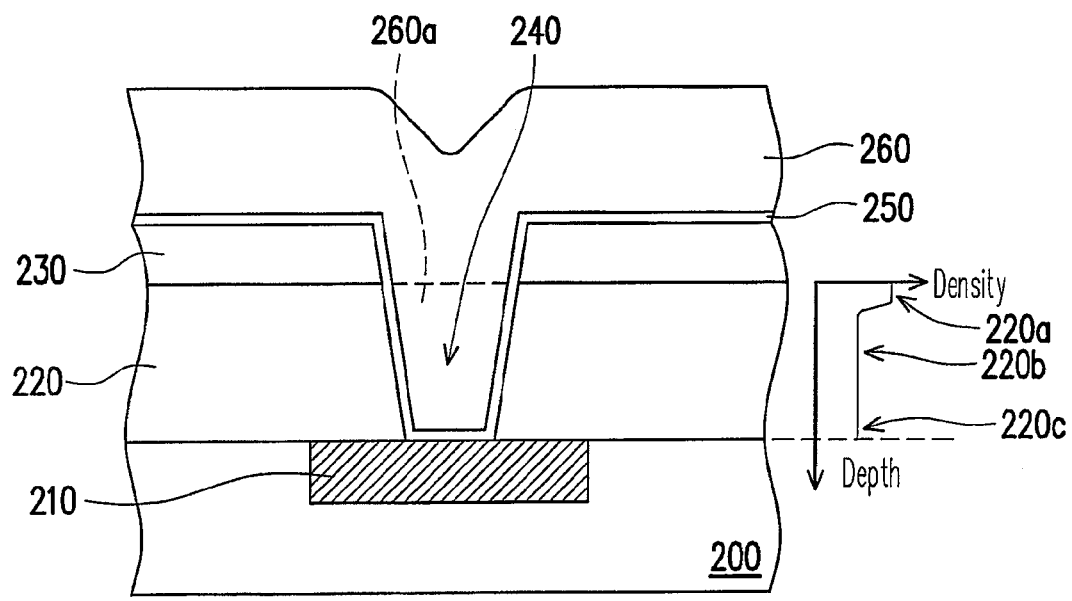
FIG. 2 depicts an interconnect process and an interconnect structure according to a first embodiment of this invention.

FIG. 2 depicts an interconnect process and an interconnect structure according to the first embodiment of this invention. In the interconnect process, a substrate 200 is provided with a conductive layer 210 to be connected thereon, wherein the material of the conductive layer 210 may be copper. A CVD process is performed to form a porous low-k layer 220 on the substrate 200 covering the conductive layer 210 and including a top portion 220a, a body portion 220b and a bottom portion 220c of the same atomic composition (e.g., $SiO_2$). The body portion 220b is between the top portion 220a and the bottom portion 220c, and the top portion 220a has a density higher than that of the body portion 220b.

Referring to FIG. 2 again, a hard mask layer 230 is formed on the porous low-k layer 220, possibly including silicon nitride formed through PECVD. A via hole 240 is then formed through the hard mask layer 230 and the porous low-k layer 220, at least exposing a portion of the conductive layer 210 to be connected. A barrier layer 250 and a conductive material layer 260 is then formed over the substrate 200. The barrier layer 250 is conformal with the substrate surface, possibly including Ti/TiN and possibly formed with MOCVD. The conductive material layer 260 fills up the via hole 240, possibly including copper and possibly formed through electroplating.

The subsequent steps include removing a portion of the conductive material layer 260 and a portion of the barrier layer 250 higher than the top of the porous low-k layer 220 and the whole hard mask layer 230 to form a conductive plug 260a, possibly with a chemical mechanical polishing (CMP) process.

When the above CVD process utilizes a framework precursor and a porogen precursor to form the porous low-k layer 220, the porogen in the pores has to be removed, possibly through heating, UV irradiation or e-beam irradiation, after the CVD process to reduce the dielectric constant of the porous low-k layer 220. The method of making the density of the top portion 220a of the porous low-k layer 220 higher than that of the body portion 220b may include decreasing the value of at least one deposition parameter negatively correlated with the density of the CVD product in an end period of the supply of the framework precursor. The top portion 220a is the portion of the porous low-k layer 220 that is deposited in the end period.

Figure 3:
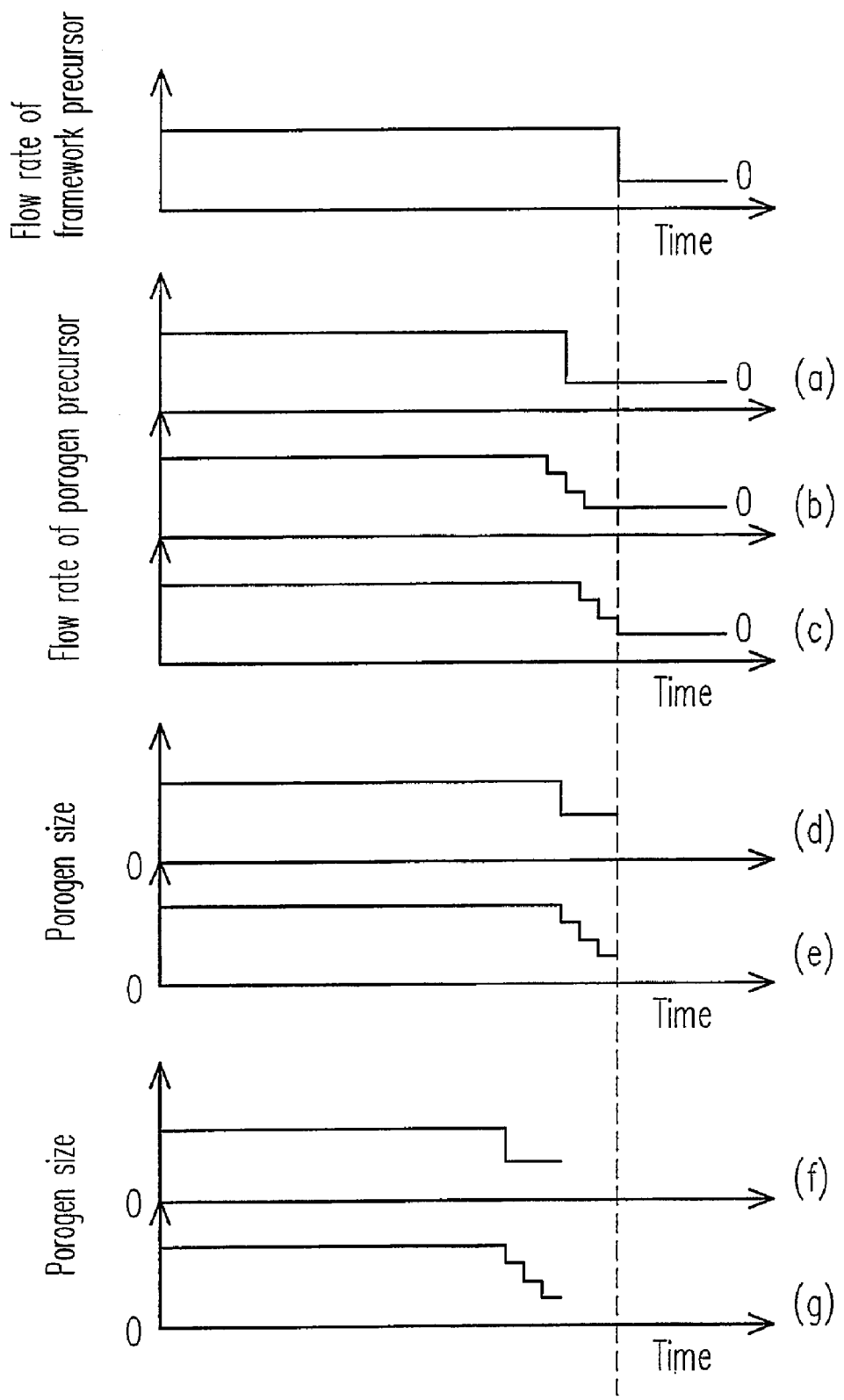
FIG. 3 shows various time-dependent profiles for the parameter that is negatively correlated with the density of the CVD product according to the first embodiment of this invention.
Figure 4:
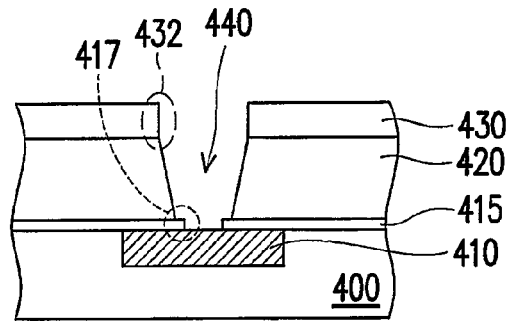
FIG. 4 depicts a kink profile formed in an etching step which forms a damascene opening in a stack of a cap layer, a porous low-k layer and a hard mask layer in the prior art.

When the deposition parameter is the flow rate of the porogen precursor, in the above end period, the flow rate may be set to zero, as shown in FIG. 3(a), or may be set to a fixed positive value, or may be decreased to zero or a positive value with time in two or more steps, as shown in FIG. 3(b) or FIG. 3(c).

When the flow rate of the porogen precursor is set to zero in the end period, the top portion 220a of the porous low-k layer 220 has no pore therein. The thickness of such a top portion 220a is preferably no more than 250 Å so that the porogen in the underlying body portion 220b and the bottom portion 220c can be removed effectively. On the other hand, the lower limit of the thickness of such a top portion 220a may be 200 Å.

When the flow rate of the porogen precursor is decreased to zero or a positive value with time in two or more steps, the pore size in the top portion 220a is the same as that in the body portion 220b. Since a portion of the porous low-k layer 220 at a larger depth is deposited earlier and more porogen precursor means more porogen produced in the CVD process and more pores in the CVD product, the pore number density in the top portion 220a increases from 0 or a positive value in two or more steps in the depth direction of the porous low-k layer 220.

When the above deposition parameter is the porogen size, in the end period, the porogen size can be constant or be decreased in two or more steps with time, as shown in FIG. 3(d) and FIG. 3(e). When the porogen size is constant in the end period, the one pore size of the top portion 220a is smaller than the one pore size of the body portion 220b. When the porogen size is decreased in two or more steps with time, the pore size in the top portion 220a increases from a positive value but is smaller than th pore size in the body portion 220b.

The porogen size is varied usually by changing the species of the introduced porogen precursor to obtain a porogen of a predetermined size. An exemplary set of porogens with different sizes is shown below.

A 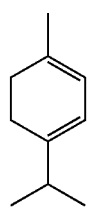

B 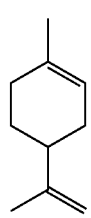

C 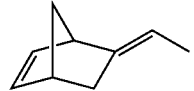

The porogens A, B and C cause pore sizes of 13 Å, 14 Å and 15 Å, respectively, and are therefore considered as porogens with different size. The porogen size is usually no more than 100 Å, preferably no more than 30 Å.

Moreover, it is also possible in this invention to decrease two or more deposition parameters negatively correlated with the density of the CVD product in the end period. For example, it is possible to decrease the pore size to a constant value and then set the flow rate of the porogen precursor to zero, as shown in FIG. 3(f), or to decrease the pore size with time in two or more steps and then set the flow rate of the porogen precursor to zero, as shown in FIG. 3(g).

Second Embodiment

Figure 5:
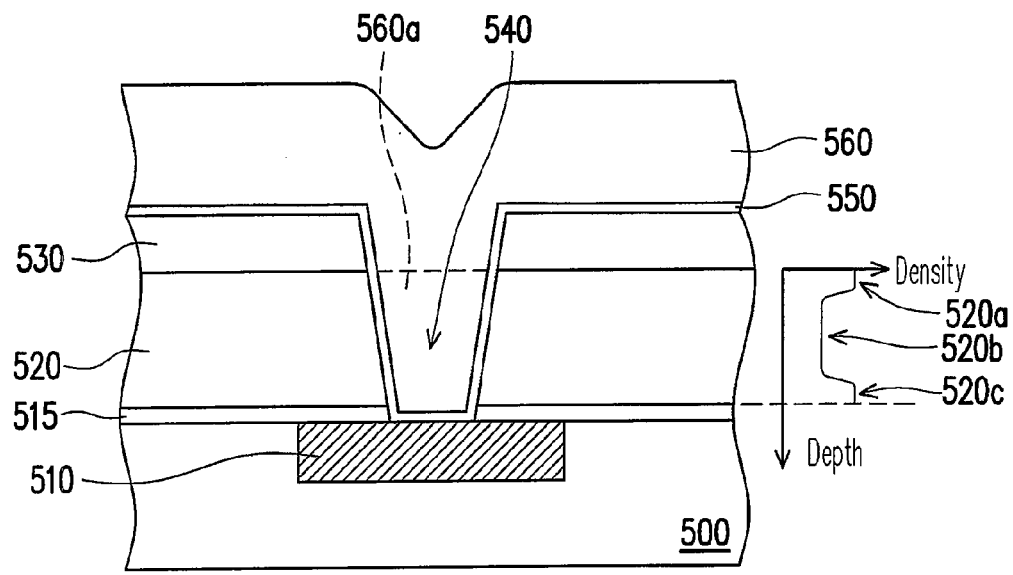
FIG. 5 depicts an interconnect process and an interconnect structure according to a second embodiment of this invention.

FIG. 5 depicts an interconnect process and an interconnect structure according to the second embodiment of this invention. In the interconnect process, a substrate 500 is provided with a conductive layer 510 to be connected thereon, wherein the material of the conductive layer 510 may be copper. A cap layer 515 is then formed on the substrate 500 covering the conductive layer 510 to be connected, possibly including silicon nitride and possibly formed with PECVD. A CVD process is performed to form a porous low-k layer 520 on the cap layer 515, including a top portion 520a, a body portion 520b and a bottom portion 520c of the same atomic composition (e.g., $SiO_2$). The body portion 520b is between the top portion 520a and the bottom portion 520c, and each of the top portion 520a and the bottom portion 520c has a density higher than that of the body portion 520b.

Referring to FIG. 5 again, a hard mask layer 530 is formed on the porous low-k layer 520, possibly including silicon nitride formed through PECVD. A via hole 540 is then formed through the hard mask layer 530, the porous low-k layer 520 and the cap layer 515, at least exposing a portion of the conductive layer 510 to be connected. A barrier layer 550 and a conductive material layer 560 are sequentially formed over the substrate 500, wherein the shape, materials and forming methods of the barrier layer 550 and the conductive material layer 560 may be the same as those in the first embodiment. The subsequent steps include removing a portion of the conductive material layer 560 and a portion of the barrier layer 550 higher than the top of the porous low-k layer 520 and the whole hard mask layer 530 to form a conductive plug 560a, possibly with a chemical mechanical polishing (CMP) process.

When the above CVD process utilizes a framework precursor and a porogen precursor to form the porous low-k layer 520, the porogen in the pores has to be removed, possibly through heating, UV irradiation or e-beam irradiation, after the CVD process to reduce the dielectric constant of the porous low-k layer 520. The method of making the density of the top portion 220a of the porous low-k layer 220 higher than that of the body portion 220b may be the same as that shown in the first embodiment and FIG. 3, i.e., decreasing the value of at least one deposition parameter negatively correlated with the density of the CVD product in an end period of the supply of the framework precursor.

On the other hand, the method of making the density of the bottom portion 520c of the porous low-k layer 520 higher than that of the body portion 520b may include setting, in an initial period of the supply of the framework precursor, the value of at least one deposition parameter negatively correlated with the density of the CVD product to be smaller that that set after the initial period but before the end period. The bottom portion 520c is the portion of the porous low-k layer 520 that is deposited in the initial.

Figure 6:
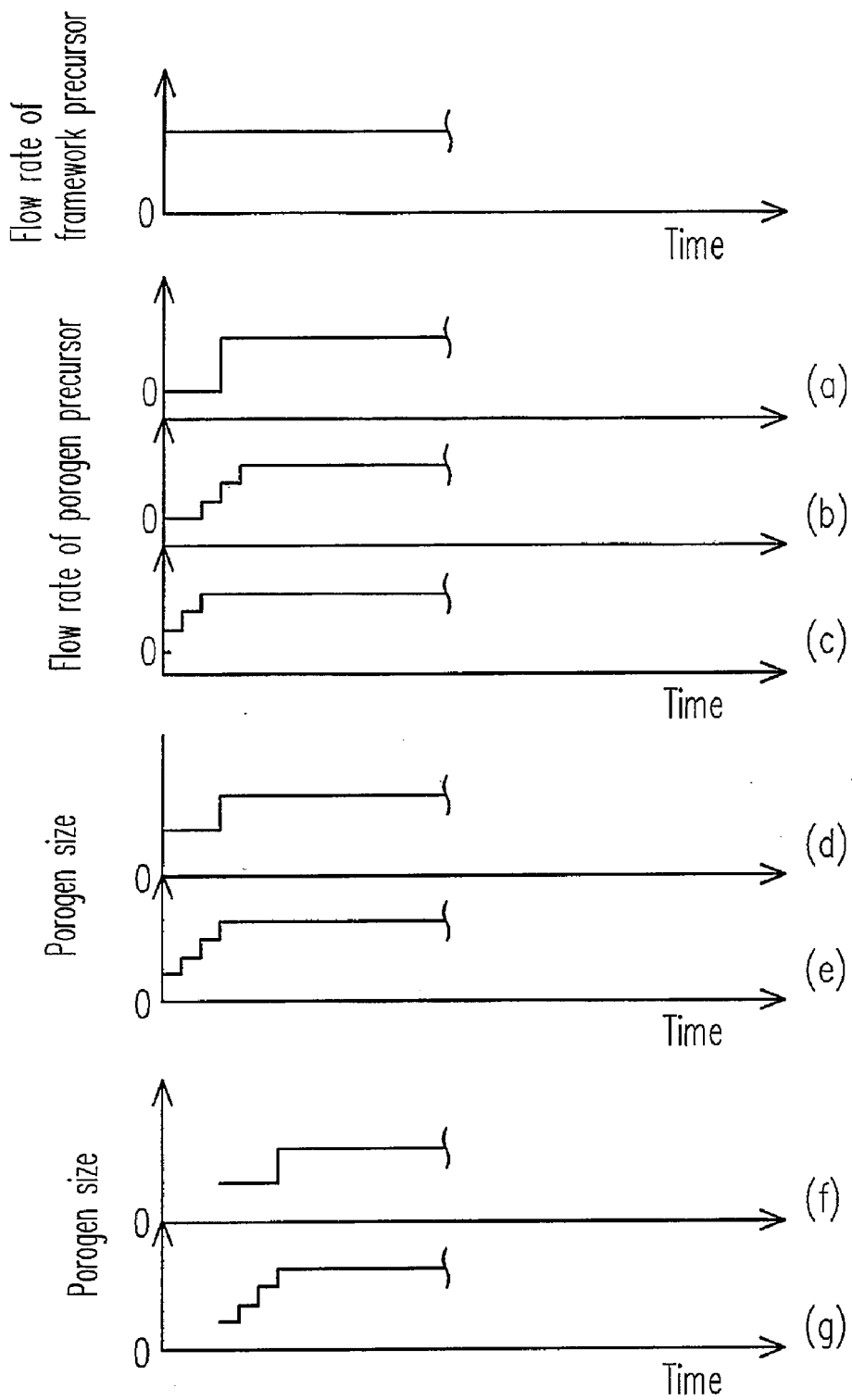
FIG. 6 shows various time-dependent profiles for the parameter that is negatively correlated with the density of the CVD product in the initial period of the CVD process according to the second embodiment of this invention.

When the deposition parameter is the flow rate of the porogen precursor, in the above initial period, the flow rate may be set to zero, as shown in FIG. 6(a), or may be set to a fixed positive value, or may be increased from zero or a positive value with time in two or more steps, as shown in FIG. 6(b) or FIG. 6(c).

When the flow rate of the porogen precursor is set to zero in the initial period, the bottom portion 520c of the porous low-k layer 520 has no pore therein. When the flow rate of the porogen precursor is increased from zero or a positive value with time in two or more steps, the pore size in the bottom portion 520c is the same as that in the body portion 520b. Since a portion of the porous low-k layer 520 at a larger depth is deposited earlier and more porogen precursor means more porogen produced in the CVD process and more pores in the CVD product, the pore number density in the bottom portion 520c decreases to 0 or a positive value in two or more steps in the depth direction of the porous low-k layer 520.

When the above deposition parameter is the porogen size, in the initial period, the porogen size can be constant or be increased with time in two or more steps, as shown in FIG. 6(d) and FIG. 6(e). When the porogen size is constant in the initial period, the one pore size of the bottom portion 520c is smaller than the one pore size of the body portion 520b. When the porogen size is increased with time in two or more steps, the pore size in the bottom portion 520c decreases from a positive value and is smaller than the pore size in the body portion 520b. The porogen size may be varied with the same method mentioned in the first embodiment. The porogen size is usually no more than 100 Å, preferably no more than 30 Å.

Moreover, it is also possible in this embodiment to decrease two or more deposition parameters negatively correlated with the density of the CVD product in the end period. For example, it is possible to set the flow rate of the porogen precursor to zero and then set the pore size to a constant value, as shown in FIG. 6(f), or to set the flow rate of the porogen precursor to zero and then increase the pore size with time in two or more steps, as shown in FIG. 6(g). In the above two cases, the lower-half fraction of the bottom portion 520c has no pore therein.

In summary, in the above first and second embodiments, the top portion of the porous low-k layer directly connected with the hard mask layer has a density higher than that of the body portion in the interconnect process. Hence, in the etching process for forming the damascene opening, the top portion can have an etching rate closer to that of the hard mask layer so that a kink profile does not easily occur to the hard mask layer and the opening can be easily filled with a conductive material.

Moreover, when the substrate is provided further having a cap layer thereon covering the conductive layer to be connected as in the second embodiment, the bottom portion of the porous low-k layer directly connected with the cap layer may also have a density higher than that of the body layer. Hence, in the etching process for forming the damascene opening, the top portion and the bottom portion each can have an etching rate closer to that of the adjacent layer so that a kink profile does not easily occur to the hard mask layer or the cap layer and the opening can be easily filled with a conductive material.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A structure of a porous low-k layer, comprising a porous bottom portion and a body portion of the same atomic composition, wherein the body portion is located on the porous bottom portion, and the porous bottom portion has a density higher than a density of the body portion.

2. The structure of claim 1, wherein a pore size in the porous low-k layer does not exceed 100 Å.

3. The structure of claim 1, wherein in the porous bottom portion of the porous low-k layer, the pore number density decreases to zero or a positive value in two or more steps in a depth direction of the porous low-k layer, and a pore size in the porous bottom portion is equal to that in the body portion.

4. The structure of claim 1, wherein the pores in the porous bottom portion has one first size, the pores in the body portion has one second size, and the one first size is smaller than the one second size.

5. The structure of claim 1, wherein in the porous bottom portion, the pore size decreases to a positive value in two or more steps in a depth direction of the porous low-k layer and is smaller than a pore size in the body portion.

6. The structure of claim 1, further comprising a top portion of the same atomic composition that is located on the body portion and has a density higher than the density of the body portion.

7. The structure of claim 6, wherein the top portion has no pore therein.

8. The structure of claim 7, wherein a thickness of the top portion does not exceed 250 Å.

9. The structure of claim 6, wherein in the top portion of the porous low-k layer, the pore number density increases from zero or a positive value in two or more steps in a depth direction of the porous low-k layer, and a pore size in the top portion is equal to that in the body portion.

10. The structure of claim 9, wherein a fraction of the top portion where the pore number density is zero has a thickness no more than 250 Å.

11. The structure of claim 6, wherein the pores in the top portion has one first size, the pores in the body portion has one second size, and the one first size is smaller than the one second size.

12. The structure of claim 6, wherein in the top portion, the pore size increases from a positive value in two or more steps in a depth direction of the porous low-k layer but is smaller than a pore size in the body portion.

13. An interconnect structure, comprising:
a substrate, having a first conductive layer thereon;
a porous low-k layer that comprises a porous bottom portion and a body portion of the same atomic composition, wherein the body portion is located on the porous bottom portion, the porous bottom portion has a density higher than a density of the body portion, and the porous bottom portion and the body portion together have a damascene opening therein over the first conductive layer; and
a second conductive layer filling up the damascene opening and contacting with the first conductive layer.

14. The interconnect structure of claim 13, wherein a pore size in the porous low-k layer does not exceed 100 Å.

15. The interconnect structure of claim 13, further comprising a cap layer located between the substrate and the porous low-k layer and penetrated by the second conductive layer.

16. The interconnect structure of claim 13, wherein in the porous bottom portion of the porous low-k layer, the pore number density decreases to zero or a positive value in two or more steps in a depth direction of the porous low-k layer, and a pore size in the porous bottom portion is equal to that in the body portion.

17. The interconnect structure of claim 13, wherein the pores in the porous bottom portion has one first size, the pores in the body portion has one second size, and the first size is smaller than the one second size.

18. The interconnect structure of claim 13, wherein in the porous bottom portion, the pore size decreases to a positive value in two or more steps in a depth direction of the porous low-k layer and is smaller than a pore size in the body portion.

19. The interconnect structure of claim 13, wherein
the porous low-k layer further comprises a top portion of the same atomic composition that is located on the body portion and has a density higher than the density of the body portion, and
the top portion, the porous bottom portion and the body portion together have the damascene opening therein over the first conductive layer.

20. The interconnect structure of claim 19, wherein the top portion has no pore therein.

21. The interconnect structure of claim 20, wherein a thickness of the top portion does not exceed 250 Å.

22. The interconnect structure of claim 19, wherein in the top portion of the porous low-k layer, the pore number density increases from zero or a positive value in two or more steps in a depth direction of the porous low-k layer, and a pore size in the top portion is equal to that in the body portion.

23. The interconnect structure of claim 22, wherein a fraction of the top portion where the pore number density is zero has a thickness no more than 250 Å.

24. The interconnect structure of claim 19, wherein the pores in the top portion has one first size, the pores in the body portion has one second size, and the one first size is smaller than the one second size.

25. The interconnect structure of claim 19, wherein in the top portion, the pore size increases from a positive value in two or more steps in a depth direction of the porous low-k layer but is smaller than a pore size in the body portion.

\* \* \* \* \*